(12) United States Patent
Lee et al.

(10) Patent No.: US 6,548,331 B2
(45) Date of Patent: Apr. 15, 2003

(54) METHOD FOR FABRICATING THIN FILM TRANSISTOR INCLUDING CRYSTALLINE SILICON ACTIVE LAYER

(75) Inventors: Seok Woon Lee, Incheon (KR); Seung Ki Joo, Seoul (KR)

(73) Assignee: PT Plus Co. Ltd. (KR)

( * ) Notice: Subject to any disclaimer, the term of this patent is extended or adjusted under 35 U.S.C. 154(b) by 0 days.

(21) Appl. No.: 09/826,439

(22) Filed: Apr. 4, 2001

(65) Prior Publication Data

US 2002/0068392 A1 Jun. 6, 2002

(30) Foreign Application Priority Data

Dec. 1, 2000 (KR) ........................................ 2000-72592

(51) Int. Cl.[7] ............................ H01L 21/00; H01L 21/84
(52) U.S. Cl. ........................ 438/149; 438/150; 438/151; 438/162
(58) Field of Search ......................... 438/149, 150–163

(56) References Cited

U.S. PATENT DOCUMENTS

| | | | | |
|---|---|---|---|---|
| 5,403,772 A | * | 4/1995 | Zhang et al. | 117/8 |
| 5,488,000 A | | 1/1996 | Zhang et al. | 437/21 |
| 5,569,610 A | | 10/1996 | Zhang et al. | 437/21 |
| 5,581,092 A | * | 12/1996 | Takemura | 257/192 |
| 5,821,562 A | | 10/1998 | Makita et al. | 257/64 |
| 6,066,547 A | | 5/2000 | Maekawa | 438/486 |
| 6,097,037 A | | 8/2000 | Joo et al. | 257/55 |
| 6,133,073 A | * | 10/2000 | Yamazaki et al. | 438/151 |
| 6,221,702 B1 | | 4/2001 | Joo et al. | 438/166 |
| 6,278,130 B1 | * | 8/2001 | Joo et al. | 257/59 |
| 6,300,659 B1 | * | 10/2001 | Zhang et al. | 514/406 |

* cited by examiner

*Primary Examiner*—Jey Tsai
(74) *Attorney, Agent, or Firm*—Baker Botts L.L.P.

(57) ABSTRACT

A method for fabricating a TFT including a crystalline silicon active layer is disclosed, in which the metal which induced the crystallization of the active layer is offset from a gate electrode utilizing a mask used to form a lightly doped drain (LDD) region or an offset junction region in the active layer. The TFT includes a silicon active layer crystallized by crystallization inducing metal and a gate electrode, and has an LDD region or an offset junction region formed in the vicinity of the channel region. The method for fabricating the TFT forms a metal offset region without using an additional photoresist forming process, and forms a LDD region by conducting a low density doping in the metal offset region. As a result, a transistor made according to the present invention has low leakage current in its off-state, and has stable electrical characteristics in its on-state.

11 Claims, 21 Drawing Sheets

Solid Phase Crystallization

Heat Treatment

High-Density Doping

Heat Treatment

High Energy Low-Density Doping

METHOD FOR FABRICATING THIN FILM TRANSISTOR INCLUDING CRYSTALLINE SILICON ACTIVE LAYER

TECHNICAL FIELD

The present invention relates to a TFT used for liquid crystal display (LCD) and organic light emitting diode (OLED), etc. More particularly, the present invention relates to a TFT including a crystalline silicon active layer providing the source, drain, and channel regions of the TFT, and to a method for fabricating a TFT including the crystalline silicon active layer.

BACKGROUND OF THE INVENTION

Thin film transistor (TFTs) used for display devices such as liquid crystal display (LCD) and organic light emitting diode (OLED) is formed by depositing a silicon layer on a transparent substrate such as a glass or quartz, forming a gate and a gate electrode on the silicon layer, implanting dopant in the source and the drain regions of the silicon layer, performing an annealing to activate the dopant, and finally forming an insulation layer thereon. An active layer constituting the source, drain, and channel regions of a TFT is formed by depositing a silicon layer on a transparent substrate such as glass by means of chemical vapor deposition (CVD) and the like. The silicon layer directly deposited on the substrate by CVD is an amorphous silicon layer, which has low electron mobility. As display devices using thin film transistors requires high operation speed and miniaturized structure, the integration degree of its driving ICs becomes higher and the aperture ratio of the pixel region becomes lower. Therefore, it is required increase the electron mobility of the silicon layer in order to form the driving circuit concurrently with the pixel TFT and to enhance the pixel aperture ratio. For this purpose, technologies for forming a polycrystalline silicon layer having high electron mobility by crystallizing an amorphous silicon layer with thermal treatment have been in use as described below.

Solid phase crystallization (SPC) method is used to anneal an amorphous silicon layer at a temperature of 600° C. or below for a few hours or tens of hours. 600° C. is the temperature causing deformation of the glass constituting the substrate. However, the SPC method has the following disadvantages. Since the SPC method requires a thermal treatment for a long time, the SPC method has low productivity. In addition, when annealing a large-sized substrate, the SPC method causes deformation of the substrate during the extended thermal treatment even at a temperature of 600° C. or below.

Excimer laser crystallization (ELC) method locally generates a high temperature on the silicon layer for a very short time by scanning an excimer laser beam to instantaneously crystallize the silicon layer. However, the ELC method has the following disadvantages. The ELC method has difficulties in accurately controlling the scanning of the laser beam. In addition, since the ELC method processes only one substrate at a time, the ELC method has relatively low productivity as compared to a method wherein a plurality of substrates are processed in a furnace at one time.

To overcome the aforementioned disadvantages of the conventional silicon crystallization methods, a method of inducing crystallization of an amorphous silicon layer at a low temperature about 200° C. by contacting or implanting metals such as nickel, gold, and aluminum has been proposed. This phenomenon that low-temperature crystallization of amorphous silicon is induced with metal is conventionally called as metal induced crystallization (MIC). However, this metal induced crystallization (MIC) method also has following disadvantages. If a TFT is manufactured by the MIC method, the metal component used to induce the crystallization of silicon remains in the crystallized silicon providing the active layer of the TFT. The metal component remaining in the active layer causes current leakage in the channel region of the TFT.

Recently, a method of crystallizing a silicon layer by inducing crystallization of amorphous silicon in the lateral direction using a metal, which is conventionally refereed to as "metal induced lateral crystallization" (MILC), was proposed. (See S. W. Lee and S. K. Joo, *IEEE Electron Device Letter*, 17(4), p. 160, 1996) In the metal induced lateral crystallization (MILC) phenomenon, metal does not directly cause the crystallization of the silicon, but the silicide generated by a chemical reaction between metal and silicon induces the crystallization of the silicon. As the crystallization proceeds, the silicide propagates in the lateral direction of the silicon inducing the sequential crystallization of the adjacent silicon region. As the metal causing this MILC, nickel and palladium or the like are known to those skilled in the art. Crystallizing a silicon layer by the MILC, a silicide containing crystallization inducing metal moves along the lateral direction as the crystallization of the silicon layer proceeds. Accordingly, little metal component is left in the silicon layer crystallized by the MILC. Therefore, the crystallized silicon layer does not adversely affect the current leakage or other characteristics of the TFT including the silicon layer. In addition, using the MILC, crystallization of silicon may be induced at a relatively low temperature of 300° C.~500° C. Thus, a plurality of substrates can be crystallized in a furnace at one time without causing any damages to the substrates.

FIG. 1A to FIG. 1D are cross-sectional views illustrating a conventional method for crystallizing a silicon active layer of TFT using the MIC and the MILC methods. Referring to FIG. 1A, an amorphous silicon layer 11 is formed on an insulation substrate 10 having a buffer layer (not shown) thereon. The amorphous silicon layer 11 is patterned by photolithography so as to form an active layer. A gate insulation layer 12 and a gate electrode 13 are formed on the active layer 11 by using conventional methods. As shown in FIG. 1B, the substrate is doped with impurity using the gate electrode 13 as a mask. Thus, a source region 11S, a channel region 11C and a drain region 11D are formed in the active layer. As shown in FIG. 1C, photoresist 14 is formed to cover the gate electrode 13, the source region 11S and the drain region 11D in the vicinity of the gate electrode 13, and a metal layer 15 is deposited over the substrate 10 and the photoresist 14. As shown in FIG. 1D, after removing the photoresist 14, the entire substrate is annealed at a temperature of 300–500° C. As a result, the source and drain regions 16 covered with the residual metal layer 14 are crystallized by the MIC caused by the metal layer 14, and the metal-offset source and drain regions 15 not covered with the metal layer and a channel region 17 under the gate electrode 13 are respectively crystallized by the MILC propagating from the source and drain regions 16 covered with the metal layer 14.

The photoresist 14 is formed to cover source and drain regions adjacent to the gate electrode 13 in order to prevent the current leakage in the channel region and the degradation of the operation characteristics of the same. If the metal layer 15 is formed to cover the entire source and drain regions, the current leakage and the degradation of the operation characteristics occur because the metal component used to cause the MIC remains in the channel region 11C and the boundaries between the channel region and the source and the drain regions. Since the operation of the source and drain regions excluding the channel region are not substantially affected by the residual metal component, the source and drain regions apart from the channel region by a distance over 0.01~5µm is crystallized by the MIC caused by the MIC metal. Meanwhile, the channel region and the source and the drain regions adjacent to the channel region are crystallized by MILC induced by and propagating from the MIC metal. Crystallizing only the channel region and its vicinity by MILC, the time required to crystallize the entire active layer may be significantly reduced. However, when using the process shown in FIGS. 1A to 1D, a step of forming a photoresist layer, a step of patterning and removing the photoresist should be included in the conventional TFT fabrication process.

FIG. 2A to FIG. 2E are cross-sectional views illustrating the sequence of the process of fabricating a crystalline silicon TFT by using solid phase crystallization (SPC) method. This process includes a step of forming a lightly doped drain (LDD) region. If an LDD region is formed in a drain region, the off-current of a transistor may be reduced and other electrical characteristics of the transistor may be stabilized.

As shown in FIG. 2A, an active layer 21 is patterned, and is subjected to a thermal treatment at a high temperature for a long time so as to perform a solid phase crystallization thereof. In this case, the substrate is made of quartz, which can sustain high temperature. As shown in FIG. 2B, a gate insulation layer 22, a lower gate electrode 23 and an upper gate electrode 24 are sequentially formed on the active layer 21 in order to form a lightly doped drain (LDD) region. Then, an ion doping process is performed in two stages. In the first ion doping stage, a high-density doping is performed to form a source region 21S and a drain region 21D as shown in FIG. 2C. Then, as shown in FIG. 2D, the upper gate electrode 24 is removed, and a low-density doping is performed to form a lightly doped drain (LDD) region 21LDD. Then, by forming a cover layer and a metal wiring according to conventional methods, a TFT having an LDD region is fabricated. By forming an LDD region in the active layer of a TFT, the off-current of the TFT may be reduced and other electrical characteristics may be stabilized. Therefore, even when fabricating a TFT using the MIC and the MILC methods as illustrated in FIGS. 1A–1D, it is desirable to form an LDD region in the active layer.

SUMMARY OF THE INVENTION

Accordingly, the present invention is directed to a method for fabricating a TFT including a crystalline silicon active layer that substantially obviates the above-mentioned problems and disadvantages of the prior art.

It is an object of the present invention to provide a method for fabricating a TFT including a crystalline silicon active layer, according to which a lightly doped drain (LDD) region is formed in the active layer without using the processes of forming and removing a photoresist layer as illustrated in FIG. 1, and yet the MIC source metal does not resides in the channel region and the vicinity thereof.

It is another object of the present invention to provide a method for fabricating a TFT including a crystalline silicon active layer, in which an offset junction region is formed in the active layer by eliminating the a low-density doping process from the processes of forming the lightly doped drain (LDD) region, and the MIC source metal does not reside in a channel region without requiring the processes of forming and removing a photoresist layer.

To achieve these and other objectives of the present invention, a method according to the present invention provides a TFT including a silicon active layer crystallized by crystallization inducing metal, a gate electrode, a lightly doped drain (LDD) region or an offset junction region formed in the active layer, wherein the crystallization inducing metal is off-set from a channel region of the active layer by using a mask used for forming the lightly doped drain (LDD) region or the offset junction region in the active layer.

Additional features and advantages of the present invention will be set forth or will be apparent from below detailed description of the invention. The objectives and other advantages of the invention will be realized and attained by the scheme particularly pointed out in the written description and claims hereof as well as the appended drawings.

BRIEF DESCRIPTION OF THE DRAWINGS

The embodiments of the present invention will be explained with reference to the accompanying drawings, in which.

DETAILED DESCRIPTION OF THE INVENTION

Reference will now be made in detail to the preferred embodiments of the present invention, examples of which are illustrated in the accompanying drawings.

Figure 1A:
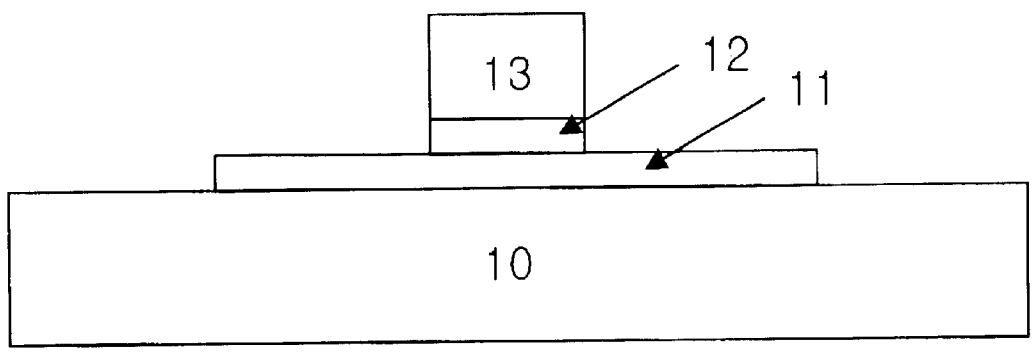
FIG. 1A to FIG. 1D are cross-sectional views illustrating the sequence of prior method for fabricating a crystalline silicon TFT by using MIC and MILC.
Figure 1B:
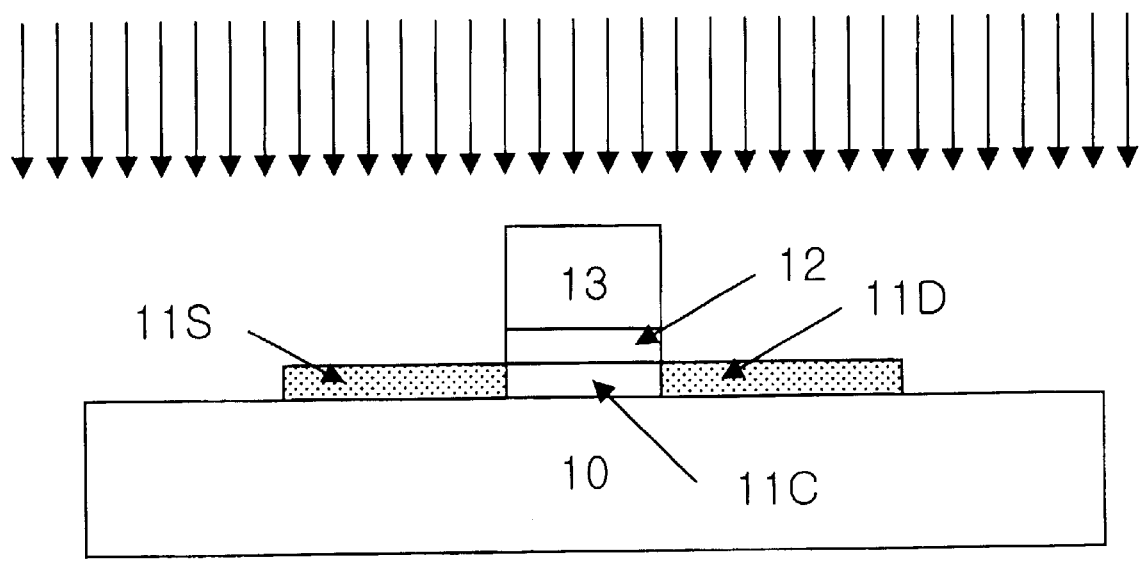
Figure 1C:
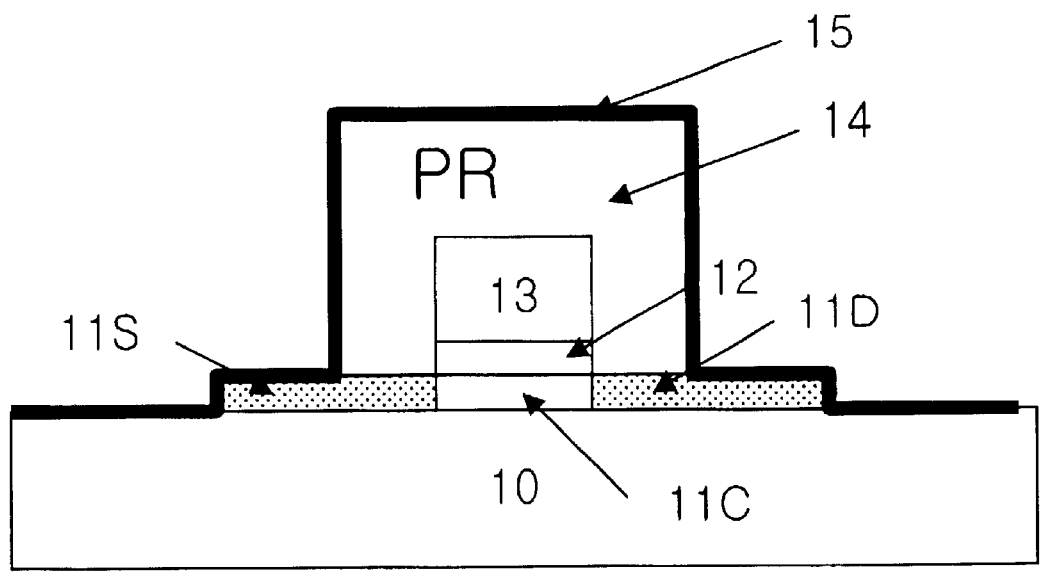
Figure 1D:
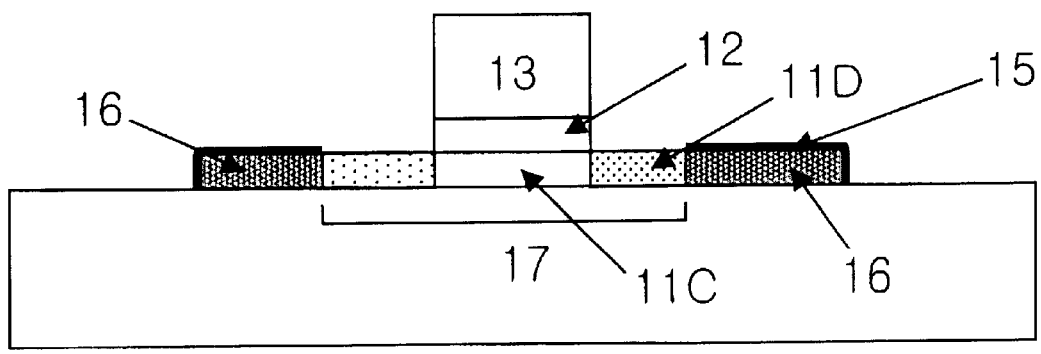
Figure 2A:
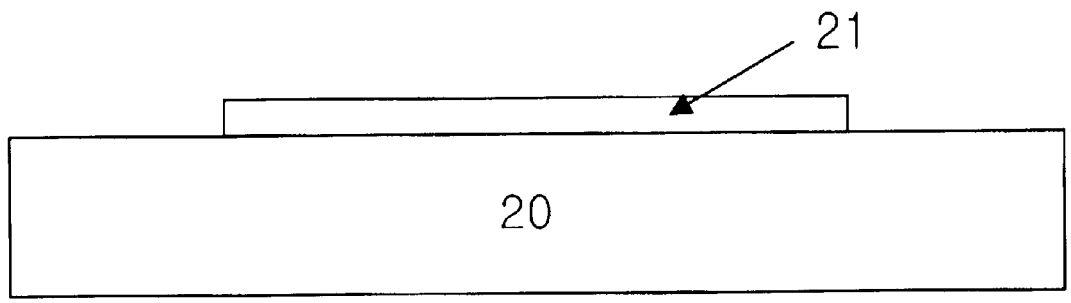
FIG. 2A to FIG. 2E are cross-sectional illustrating the sequence of another prior method for fabricating a crystalline silicon TFT having a lightly doped drain (LDD) region.
Figure 2B:
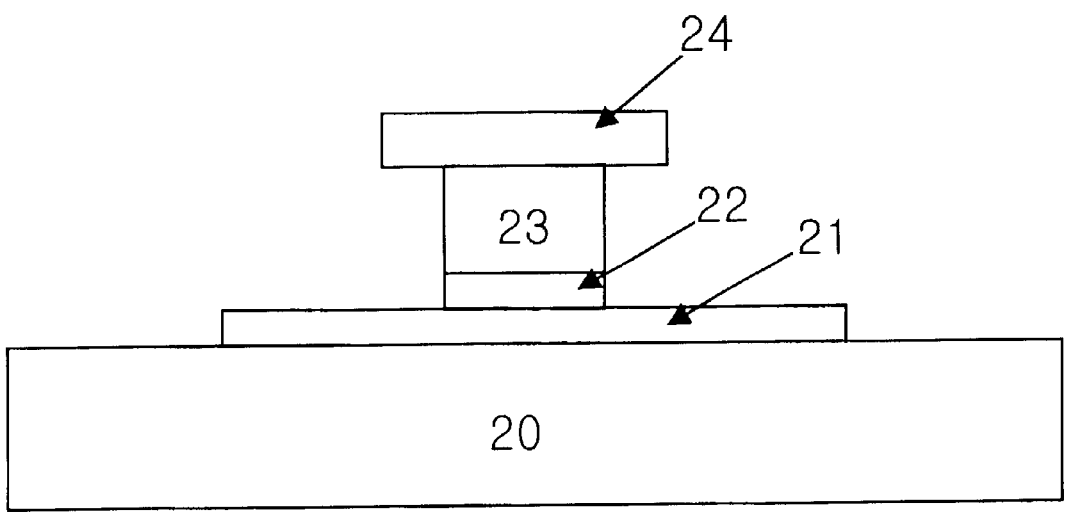
Figure 2C:
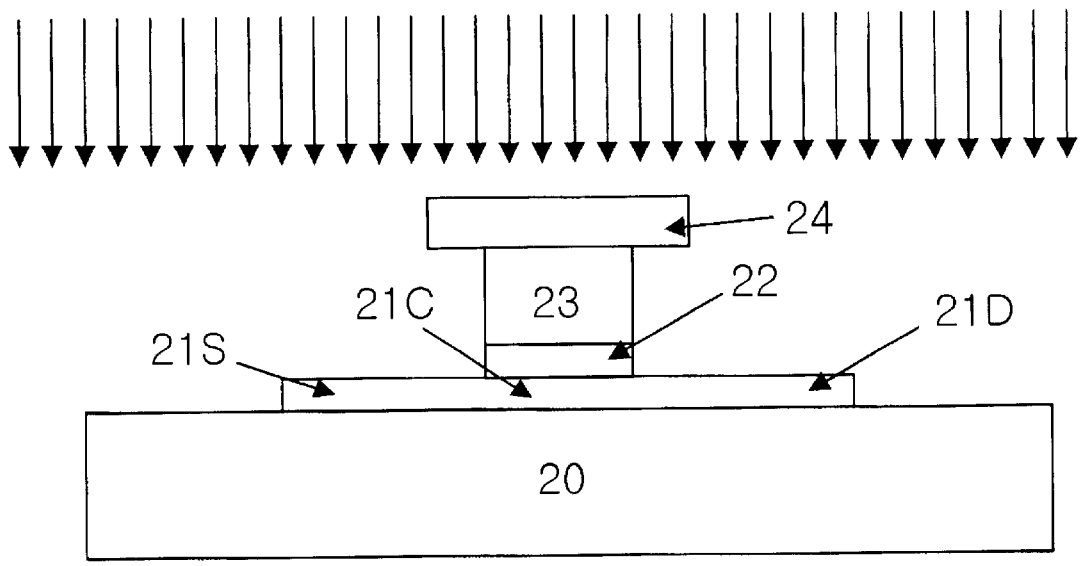
Figure 2D:
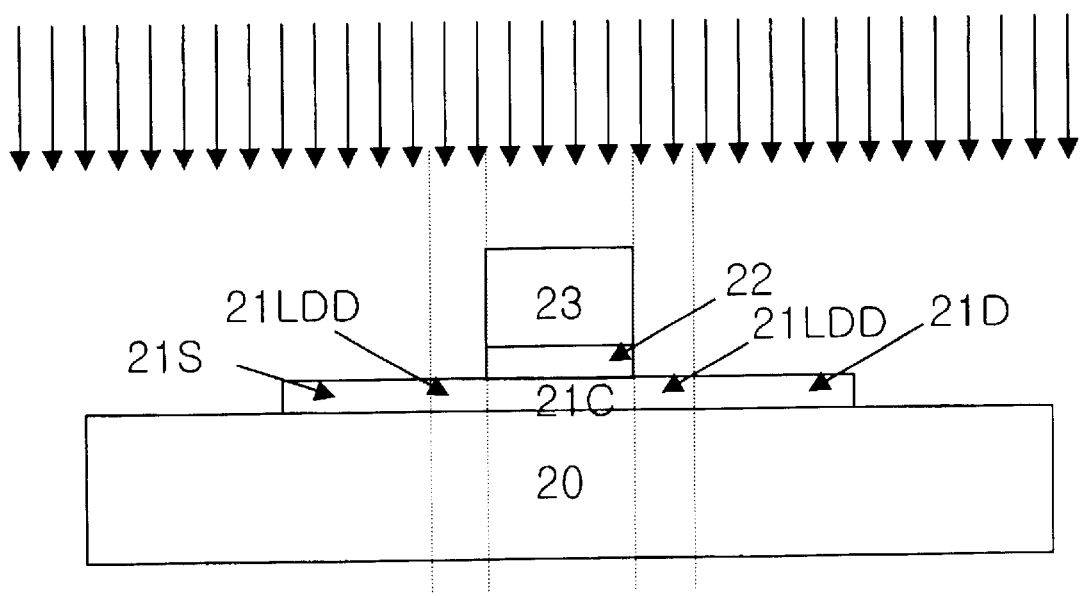
Figure 2E:
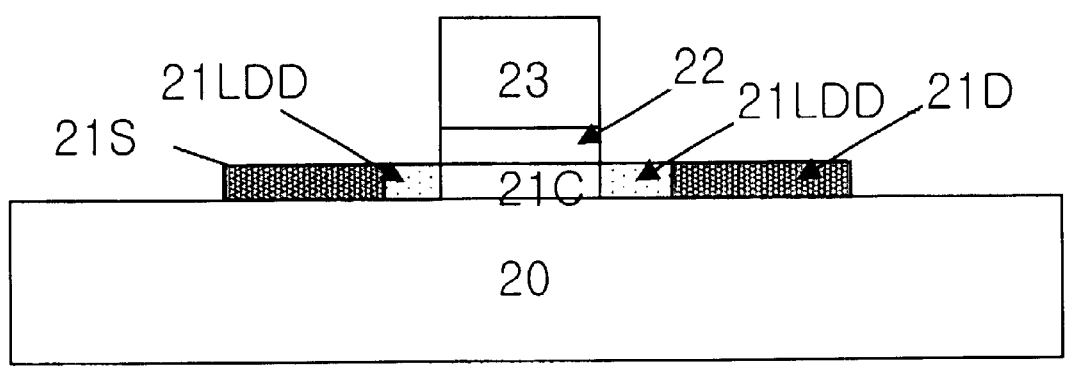
Figure 3A:
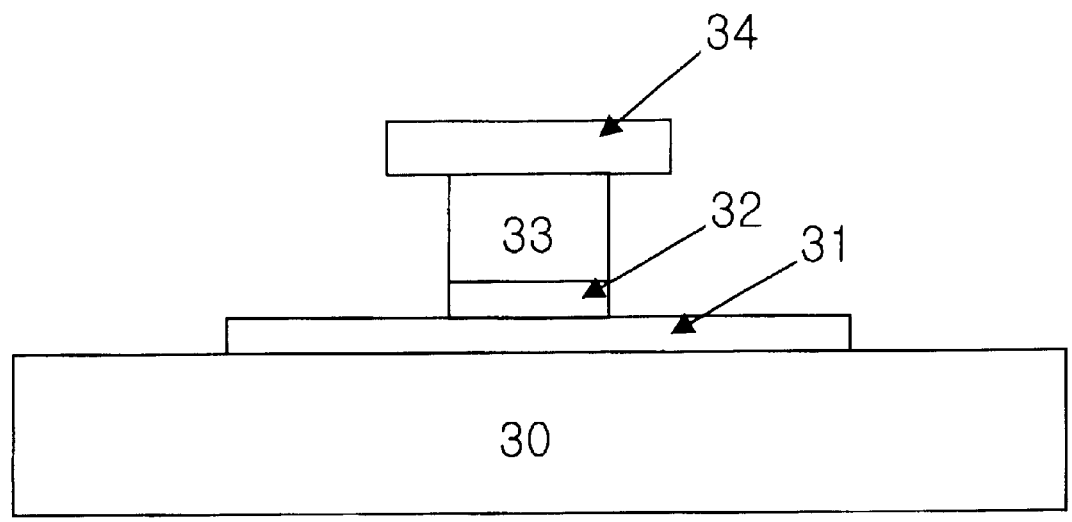
FIG. 3A to FIG. 3F are cross-sectional views illustrating the sequence of a method for fabricating a crystalline silicon TFT according to a first preferred embodiment of the present invention.
Figure 3B:
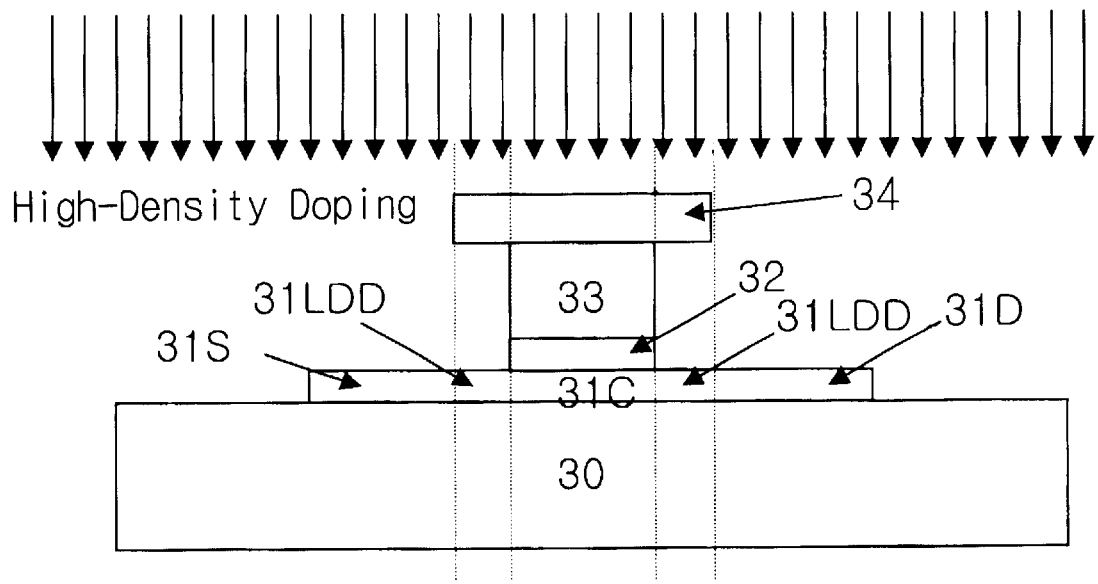

FIG. 3A to FIG. 3F are cross-sectional views illustrating the sequence of a method for fabricating a crystalline silicon TFT by using the MILC according to a first embodiment of the present invention. Referring to FIG. 3A, an amorphous silicon layer 31 to form an active layer of a TFT is formed and patterned on an insulation substrate 30. A gate insulation layer 32, a lower gate electrode 33, and an upper gate electrode 34 are formed on the amorphous silicon layer 31. Referring to FIG. 3B, a high-density impurity is doped in the amorphous silicon layer 31 by using the gate electrode 34 as a mask, thereby forming a source region 31S and a drain region 31D. When fabricating an NMOS (N-channel metal oxide semiconductor) TFT, the silicon layer 31 is doped with a dopant such as $PH_3$, P and As with a dose of 1E14-1E22/$cm^3$ (preferably 1E15-1E21/$cm^3$) at an energy level of 10–200 KeV (preferably 30–100 KeV) by using ion shower doping method, ion implantation method, or another ion implantation methods in the process of FIG. 3B. On the other hand, when fabricating a PMOS (P-channel metal oxide semiconductor), the silicon layer 31 is doped with a dopant such as $B_2H_6$, B and $BH_3$ with a dose of 1E13-1E22/$cm^3$ (preferably 1E14~1E21/$cm^3$) at an energy level of 20–70 KeV in the process of FIG. 3B.

Figure 3C:
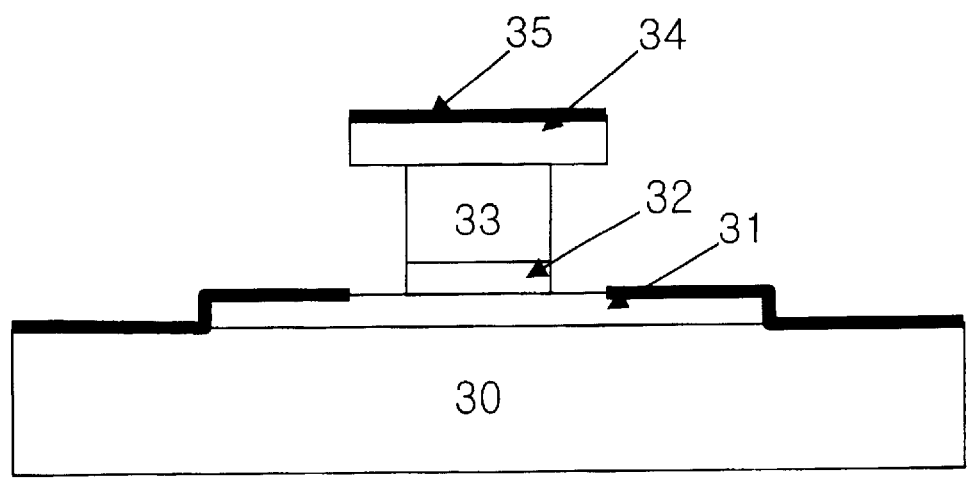

Then, as shown in FIG. 3C, a metal layer 35 such as Ni inducing crystallization of the amorphous silicon layer 31 is formed on the amorphous silicon layer 31 and the substrate 30 using the gate electrode 34 as a mask. As the metal for inducing the crystallization of the amorphous silicon layer, Ni or Pd is preferably used, but other metals such as Ti, Ag, Au, Al, Sn, Sb, Cu, Co, Cr, Mo, Tr, Ru, Rh, Cd and Pt or the material containing at least one of these metals also can be used to form the metal layer 35. The crystallization inducing metal such as Ni, Pd is applied on the silicon layer by sputtering, heating evaporation, PECVD (plasma enhanced chemical vapor deposition), solution coating or ion implantation. However, sputtering method is preferably used to form the metal layer 35. The thickness of the metal layer 35 may be selected within a range in which the crystallization of the amorphous silicon layer 31 is properly induced. The metal layer 35 is formed with a thickness of about 1 Å to 10,000 Å. Preferably, the metal layer 35 is formed with a thickness of about 10 Å to 200 Å. If the width of the upper gate electrode 34 is wider than that of the lower gate electrode 33, the crystallization inducing metal layer is not formed in the portion of the silicon layer indicated with 31LDD, where an LDD region is formed. Thus, the crystallization inducing metal is offset from the channel region 31C by a predetermined distance. If the channel region is directly in contact with the crystallization inducing metal without a metal offset region between the channel region 31C and the metal layer 35, the metal component used to induce the crystallization of the silicon layer resides in the channel region after crystallization of the silicon layer. Then, the residual metal component deteriorates the characteristics of the transistor. In the present invention, the width of the metal offset region between the crystallization inducing metal and the channel region, which is to form the LDD region 31LDD later, is set within a range of 100 Å~20,000 Å. Preferably, the width of the metal offset region is set within a range of 5,000 Å~20,000 Å. In the present invention, the order of the high density doping process and the MIC metal forming process may be switched without affecting the effects of the present invention.

Figure 3D:
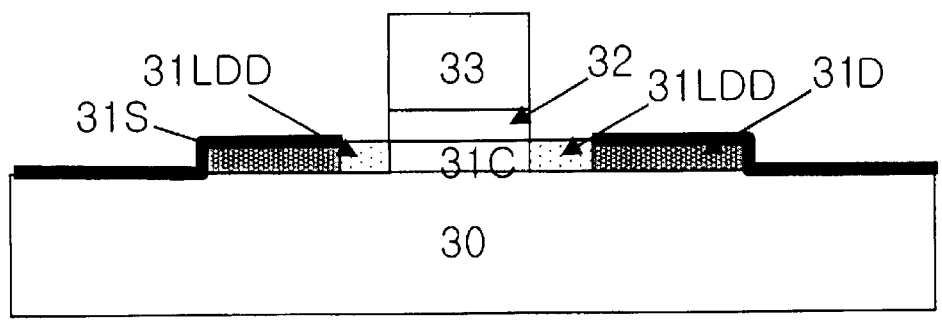
Figure 3E:
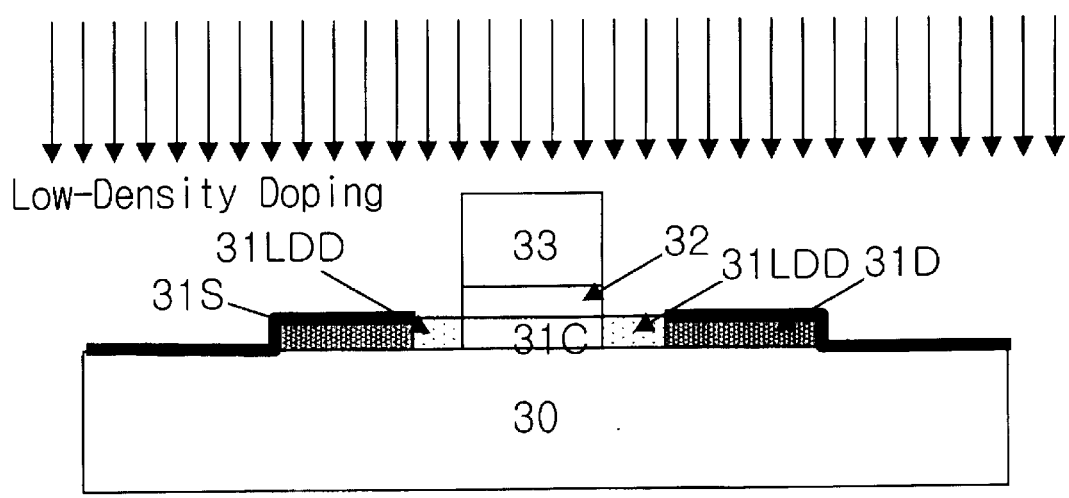
Figure 3F:
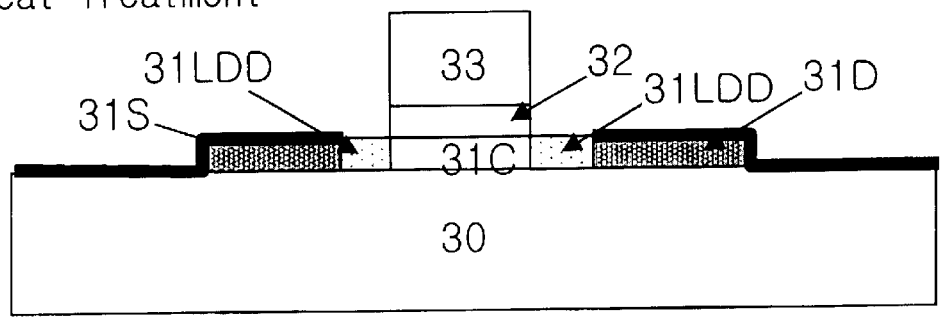

After forming the crystallization inducing metal layer 35, the upper gate electrode 34 is removed as shown in FIG. 3D. Then, as shown in FIG. 3E, an impurity is doped with a low density using the lower gate electrode 33 as a mask. Thus, an LDD region is formed in the vicinity of the channel region 31C. In the low-density doping process of FIG. 3E, the silicon layer 31 is doped with a dopant such as $PH_3$, P and As with a dose of 1E11~1E20/$cm^3$ using ion shower doping method, ion implantation method or other ion implantation methods to fabricate an NMOS (N-channel metal oxide semiconductor) TFT. On the other hand, when fabricating a PMOS (P-channel metal oxide semiconductor) TFT, the silicon layer 31 is doped with a dopant such as $B_2H_6$, B and $BH_3$ a dose of 1E11~1E20/$cm^3$ in the low-density doping process of FIG. 3E, After forming the LDD region by the low-density doping process, a thermal treatment is performed to crystallize the active layer as shown in FIG. 3F, and an insulation layer and contact electrodes (not shown) are respectively formed on the active layer to fabricate a TFT. The thermal treatment of FIG. 3F may use any methods that may cause metal induced crystallization (MIC) of the amorphous silicon. For example, as the thermal treatment method causing the MIC, RTA (rapid thermal annealing) or ELC (excimer laser crystallization) method may be used. The RTA method performs heating at a temperature of about 500° C.~1,200° C. for a few seconds or a few minutes using a tungsten-halogen lamp or a xenon arc lamp. The ELC method heats the active layer to a very high temperature for a very shot time using an excimer laser. Particularly, in the present invention, the heating process is preferably performed in a furnace at a temperature of 400° C.~600° C. for 0.1~50 hours, desirably for 0.5~20 hours. Since the furnace annealing method crystallizes the amorphous silicon at a temperature lower than the deformation temperature of the glass substrate, deformation or damage of the glass substrate may be prevented. In addition, because the furnace annealing method may process a plurality of substrates at one time, it substantially enhances the productivity of the process. During the thermal treatment, the portions of the silicon layer covered with the MIC metal are crystallized by the MIC cause by the MIC source metal and the portion of the silicone layer not covered with the MIC metal is crystallized by the MILC propagated from the MIC region to which the MIC metal is applied. In addition, since the thermal treatment condition for crystallizing the amorphous silicon layer by the MIC is similar to the annealing condition used to activate the dopant implanted in the active layer, the crystallization of the active layer and the activation of the dopant may be conducted in a single process.

When a TFT is fabricated by the aforementioned method, a metal offset region can be formed without including the process of forming a photoresist pattern in order to offset the MIC metal from the channel region, and a TFT having an LDD region may be fabricated by simply conducting a low-density doping in the metal offset region. This transistor has low leakage current and stable electrical characteristics. Although a first preferred embodiment shown in FIGS. 3A~3F has been disclosed for the purpose of illustration, the present invention can be also embodied as other embodiments that will be described below. The process conditions for other embodiments are the same as those of the first embodiment unless mentioned otherwise in this specification.

Figure 4A:
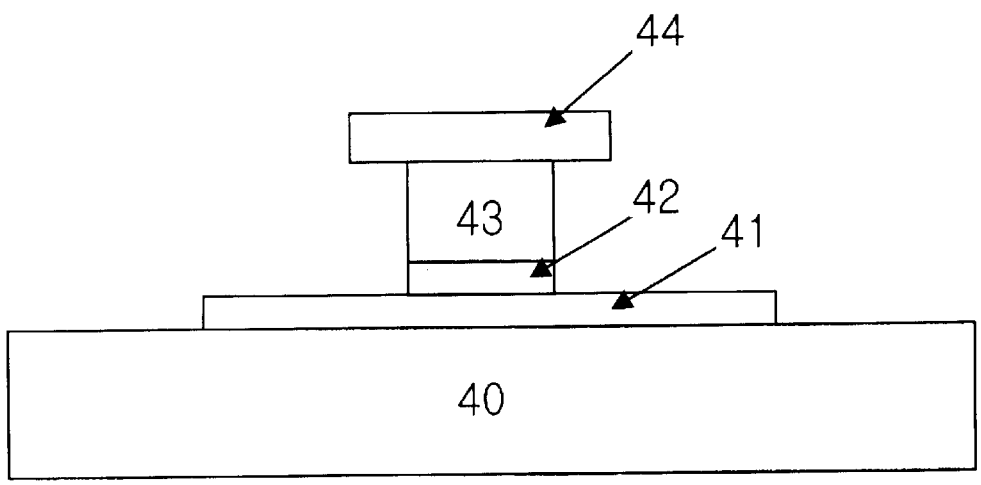
FIG. 4A to FIG. 4F are cross-sectional views illustrating the sequence of a method for fabricating a crystalline silicon TFT according to a second preferred embodiment of the present invention.
Figure 4B:
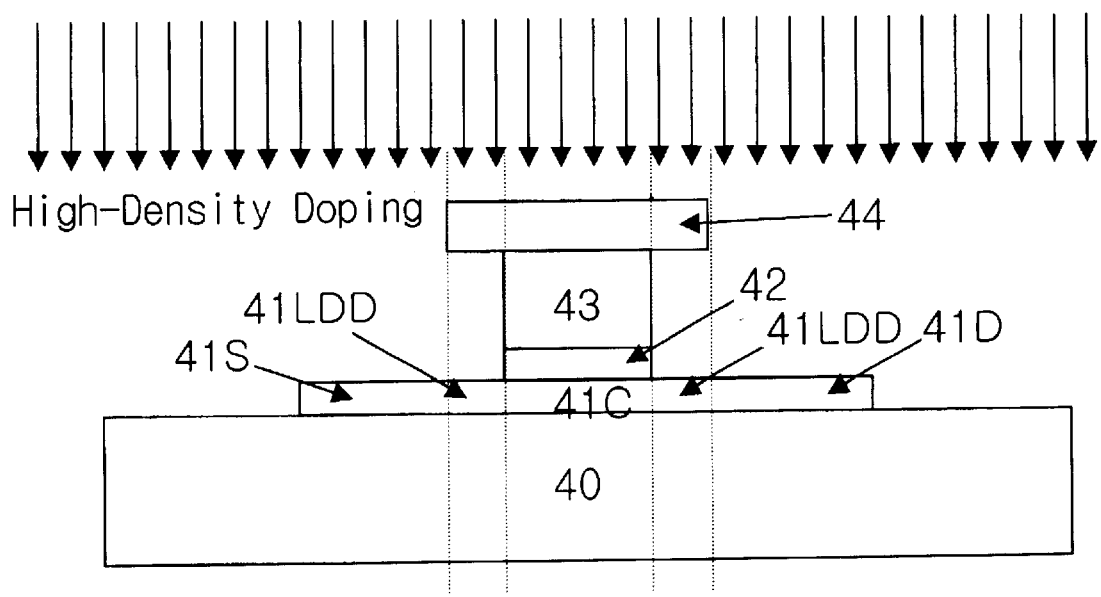
Figure 4C:
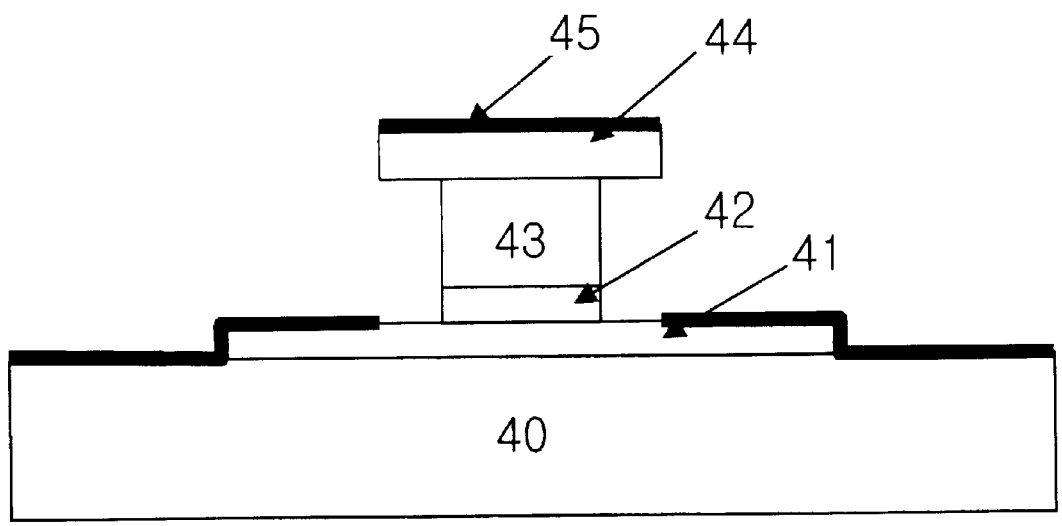
Figure 4D:
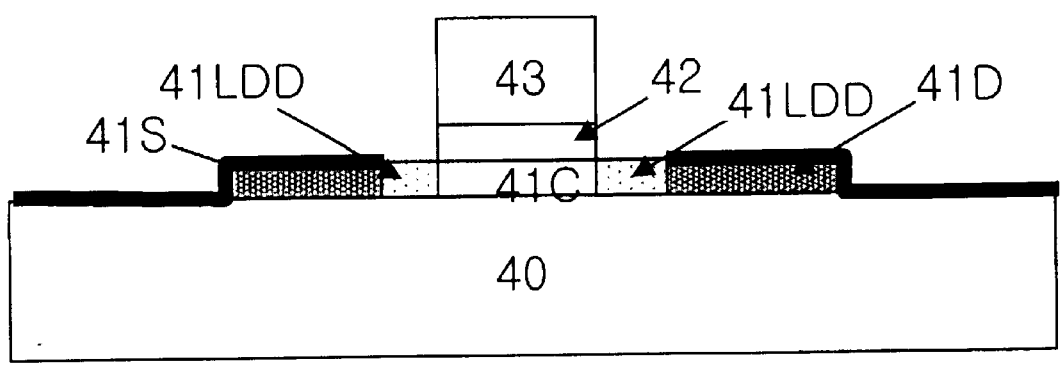
Figure 4E:
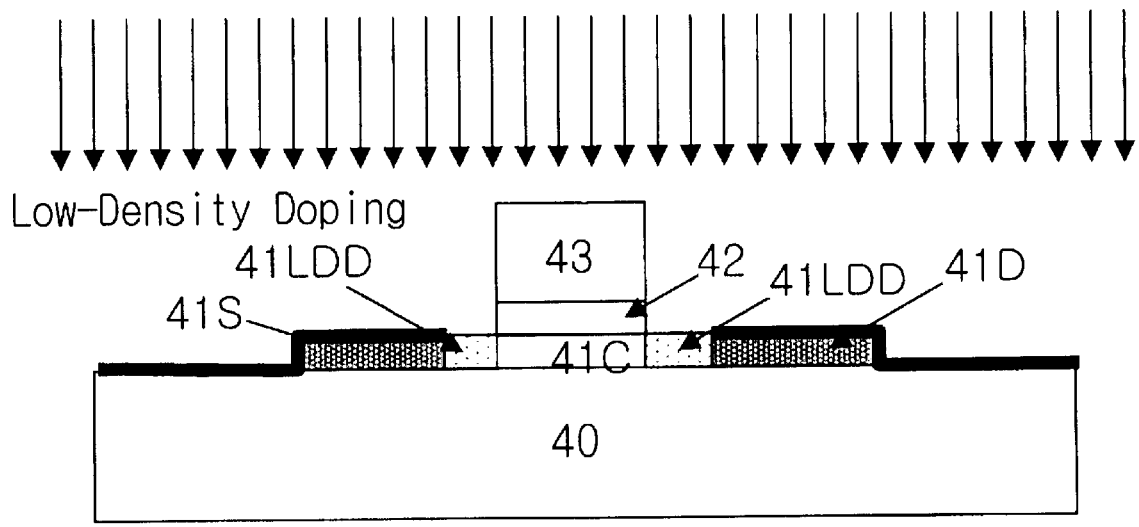
Figure 4F:
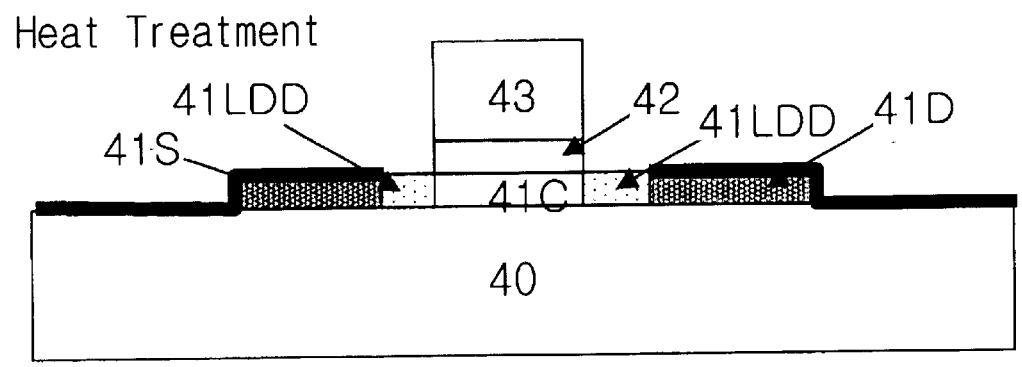

FIG. 4A to FIG. 4F are cross-sectional views illustrating the process for fabricating a crystalline silicon TFT according to a second preferred embodiment of the present invention. Referring to FIG. 4A, an amorphous silicon layer 41 providing the active layer of a TFT is formed and patterned on an insulation substrate 40. A gate insulation layer 42 and a gate electrode 43 are formed on the amorphous silicon layer 41. As shown in FIG. 4A, with the photoresist 44 used to form the gate electrode 43 remaining on the gate electrode, the gate electrode 43 is over-etched to form an undercut below the photoresist 44. Then a high-density doping is performed to form a source region 41S and a drain region 41D as shown in FIG. 4B. Then, as shown in FIG. 4C, MIC source metal 45 is formed on the silicon layer using the photoresist 44 as a mask. As mentioned with respect to the first preferred embodiment, the order of the high-density doping process and the MIC metal forming process may be switched within the scope of the present invention and without affecting the effects of the present invention. In this case, since the MIC metal is not formed on the portion indicated as 41LDD, which will form an LDD region, a metal offset region is formed around the gate electrode 43. Then, the photoresist 44 is removed as shown in FIG. 4D. As shown in FIG. 4E, a low-density impurity doping is conducted using the gate electrode 43 as a mask, thereby forming the LDD region 41LDD. Finally, as shown in FIG. 4F, thermal treatment to crystallize the active layer is conducted, and a transistor is fabricated according to conventional methods.

Figure 5A:
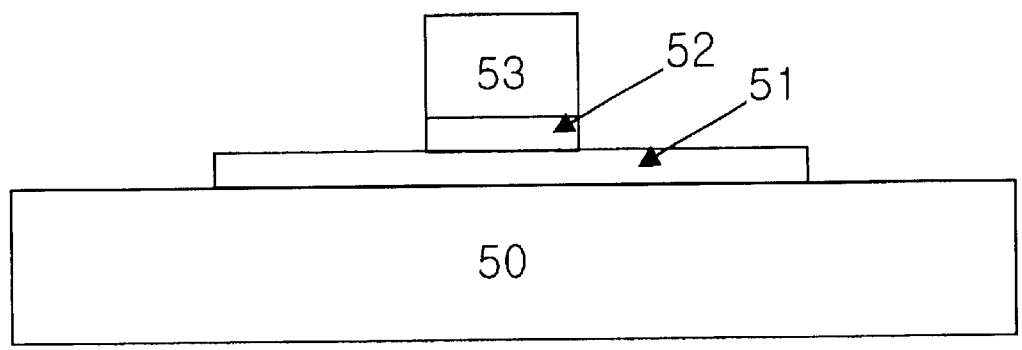
FIG. 5A to FIG. 5E are cross-sectional views illustrating the sequence of a method for fabricating a crystalline silicon TFT according to a third preferred embodiment of the present invention.
Figure 5B:
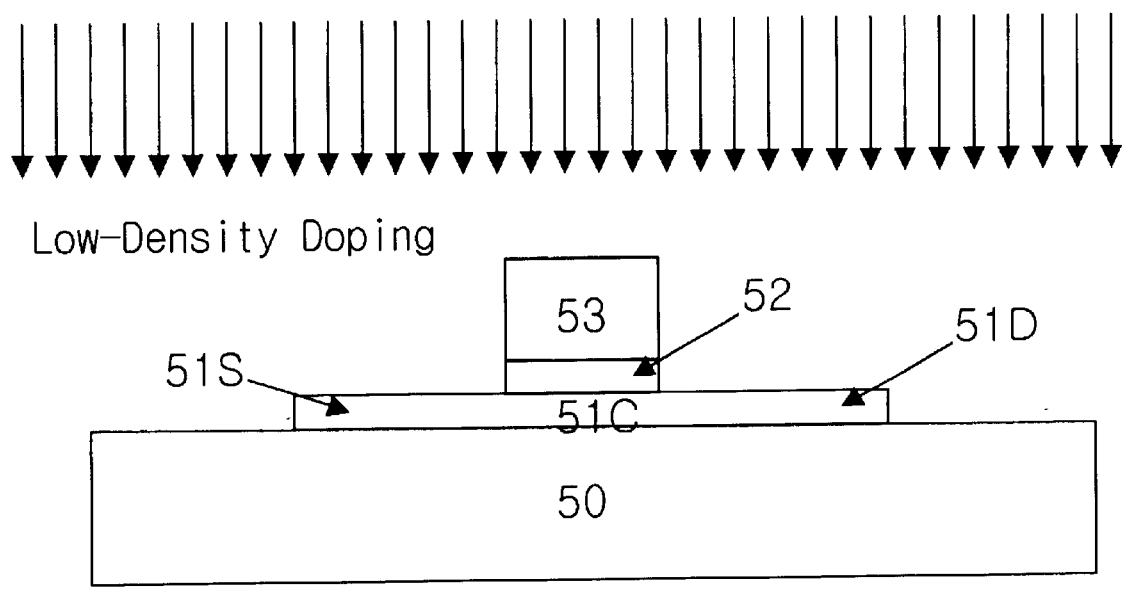
Figure 5C:
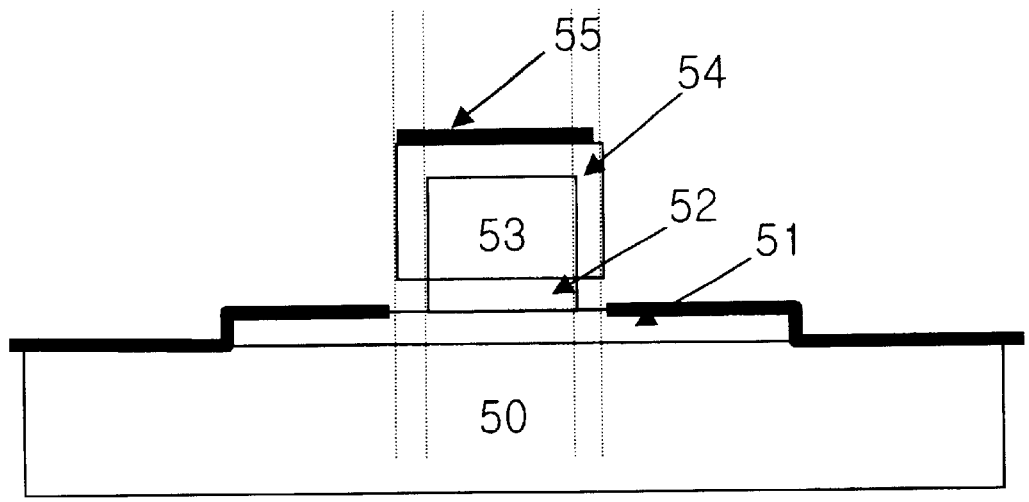
Figure 5D:
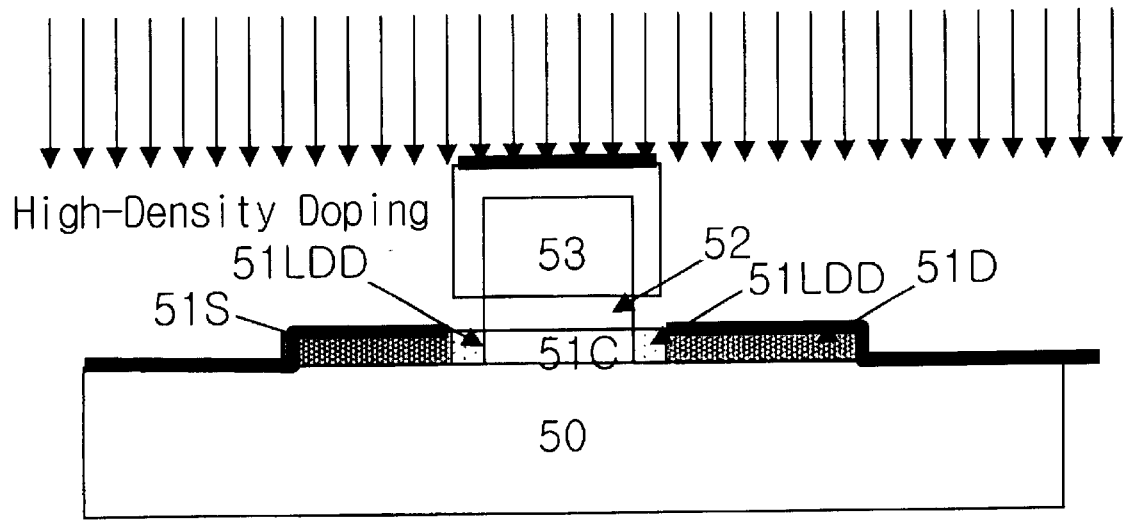
Figure 5E:
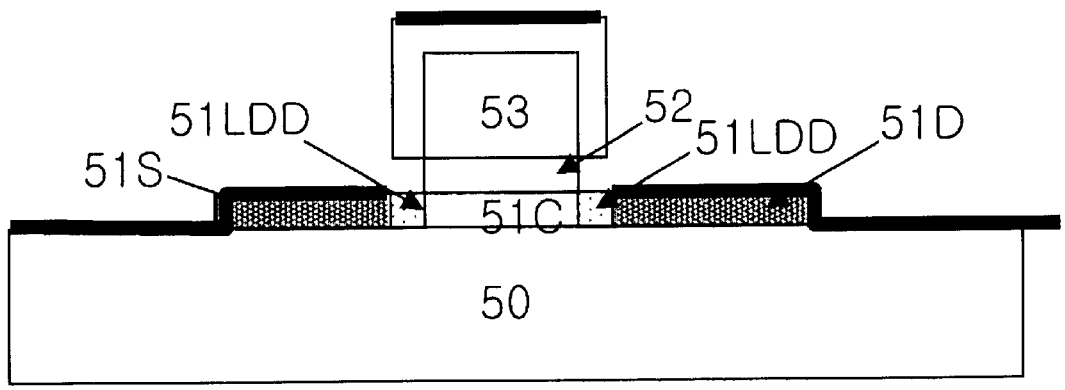

FIG. 5A to FIG. 5E are cross-sectional views illustrating the method for fabricating a crystalline silicon TFT according to a third preferred embodiment of the present invention. Referring to FIG. 5A, an amorphous silicon layer 51 providing the active layer of a TFT is formed and patterned on an insulation substrate 50. A gate insulation layer 52 and a gate electrode 53 are formed on the amorphous silicon layer 51. As shown in FIG. 5B, a low-density doping is conducted using the gate electrode 53 as a mask. The gate electrode 53 is anodized to form an anodic oxide layer 54 on the surface of the gate electrode 53. Then, as shown in FIG. 5C, MIC source metal 55 is formed on the entire area of the substrate and a metal offset region is created around the gate electrode 53 due to the anodic oxide layer 54. Then, a high-density impurity doping is performed to create a source region 51S and drain region 51D as shown in FIG. 5D. As mentioned above, the order of the high-density doping process and the MIC metal forming process may be switched within the scope of the present invention and without affecting the effects of the present invention. Then, as shown in FIG. 5E, a thermal treatment is conducted to crystallize the active layer, and a transistor is fabricated according to conventional methods. According to the present invention, a high-density doping is not conducted on part covered by the anodic oxide layer 54 formed on the gate electrode 53, thereby forming an LDD region in the vicinity of the gate electrode 53.

Figure 6A:
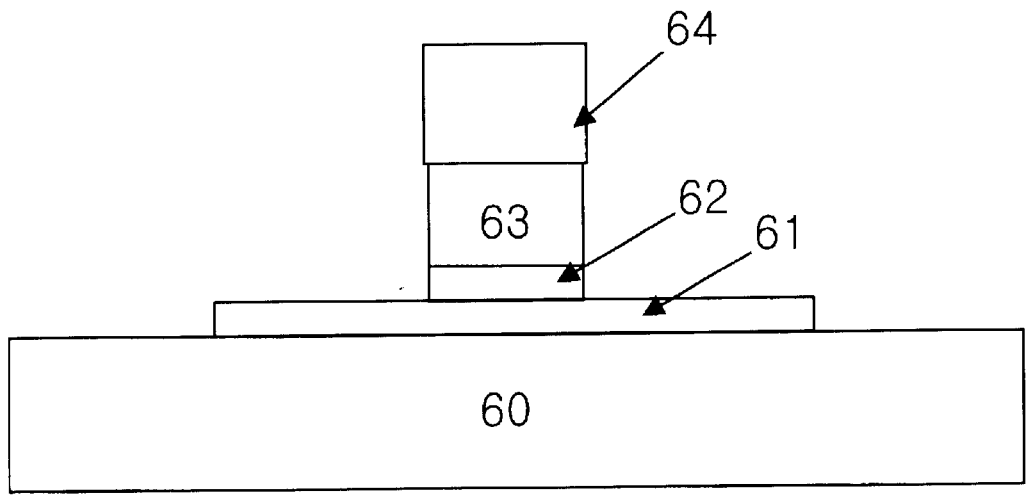
FIG. 6A to FIG. 6E are cross-sectional views illustrating the sequence of a method for fabricating a crystalline silicon TFT according to a fourth preferred embodiment of the present invention.
Figure 6B:
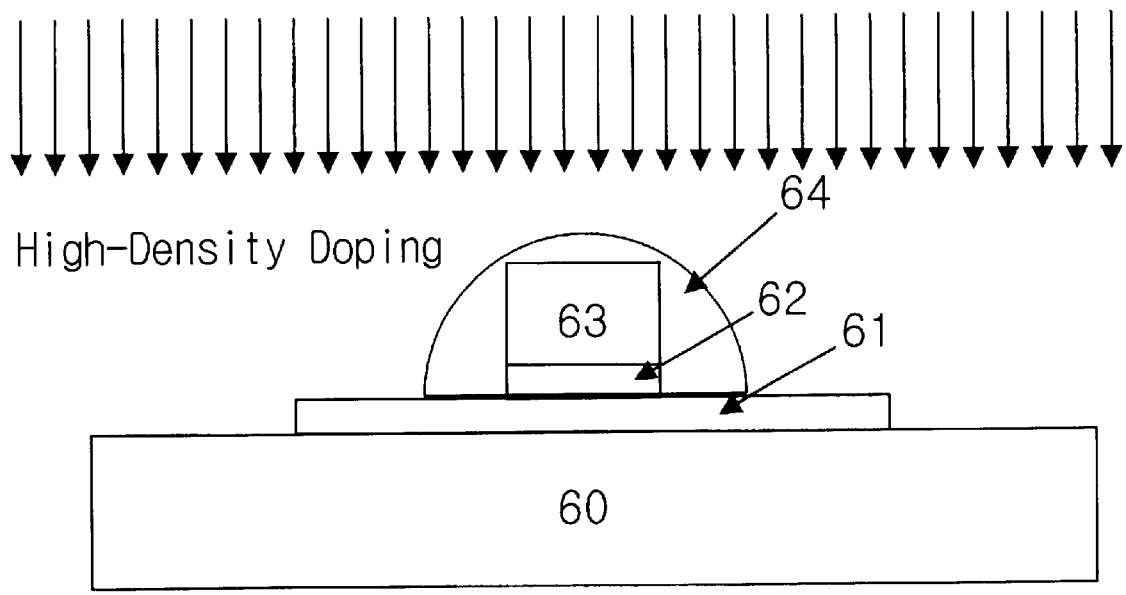
Figure 6C:
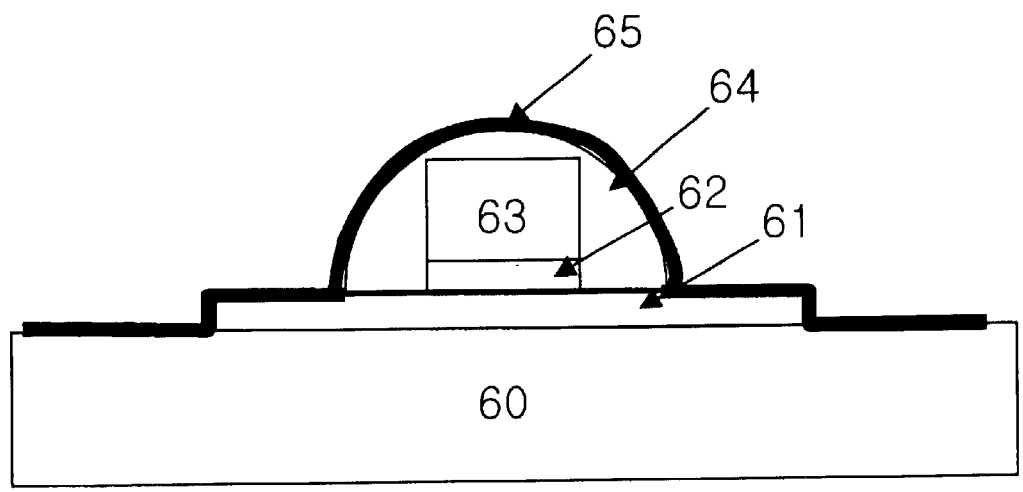
Figure 6D:
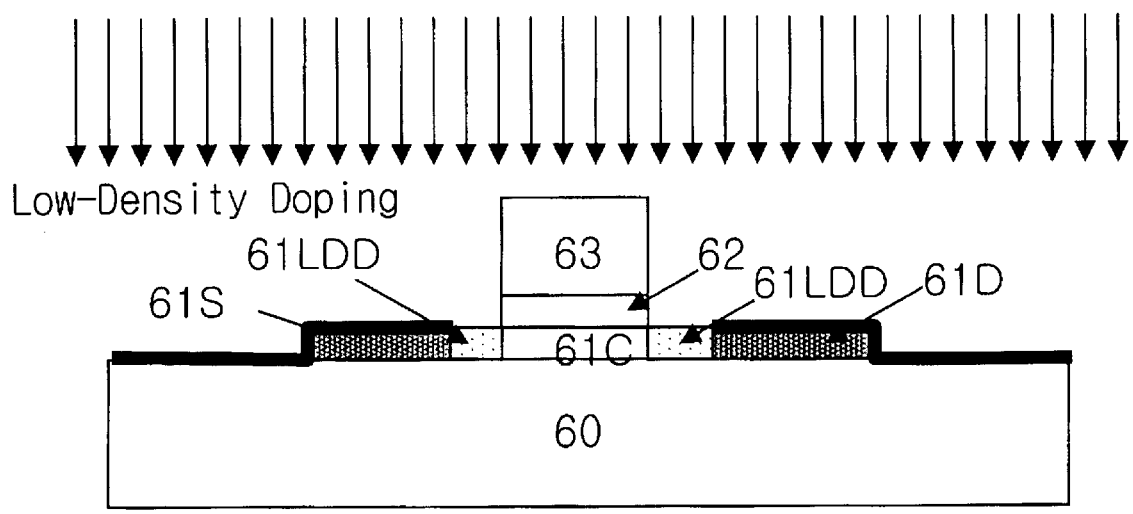
Figure 6E:
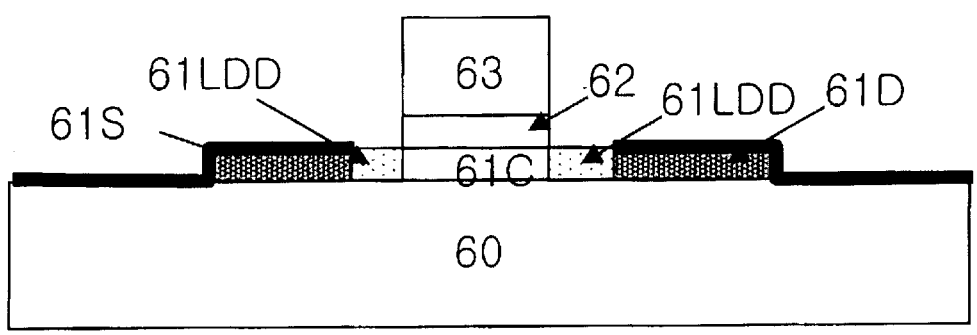

FIG. 6A to FIG. 6E are cross-sectional views illustrating the method for fabricating a crystalline silicon TFT according to a fourth preferred embodiment of the present invention. Referring to FIG. 6A, an amorphous silicon layer 61 providing the active layer of TFT is formed and patterned on an insulation substrate 60. A gate insulation layer 62 and the gate electrode 63 are formed on the amorphous silicon layer 61. FIG. 6A shows a state where the photoresist 64 used to form gate electrode 63 remains on the gate electrode. The photoresist 64 is re-flowed at a temperature higher than the hard baking temperature of the photoresist. Then, as shown in FIG. 6B, a high-density doping is conducted using the re-flowed photoresist as a mask to form source and drain regions in the active layer. Then, as shown in FIG. 6C, MIC metal 65 is formed on the entire area of the substrate. Then, as shown in FIG. 6D, the re-flowed photoresist 64 is removed and a low-density impurity doping is conducted to from LDD regions indicated as 61LDD in the active layer. Since the MIC source metal is not formed on the LDD regions 61LDD, a metal offset region is simultaneously formed around the gate electrode when forming the LDD regions. As mentioned above, the order of the high-density doping process and the MIC source metal forming process may be switched within the scope of the present invention and without affecting the effects of the present invention. As shown in FIG. 6E, thermal treatment is performed to crystallize the active layer, and a transistor is fabricated according to prior art.

Figure 7A:
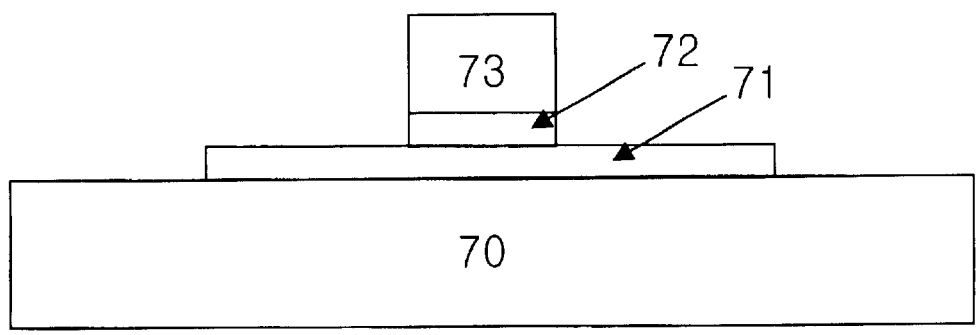
FIG. 7A to FIG. 7G are cross-sectional views illustrating the sequence of a method for fabricating a crystalline silicon TFT according to a fifth preferred embodiment of the present invention.
Figure 7B:
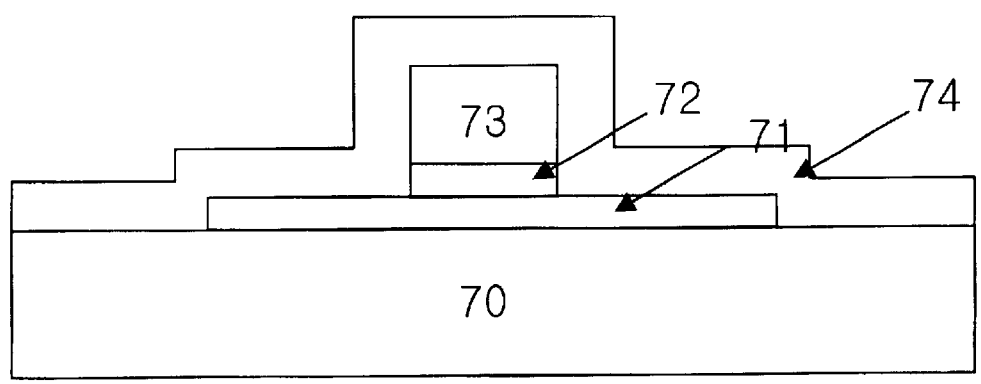
Figure 7C:
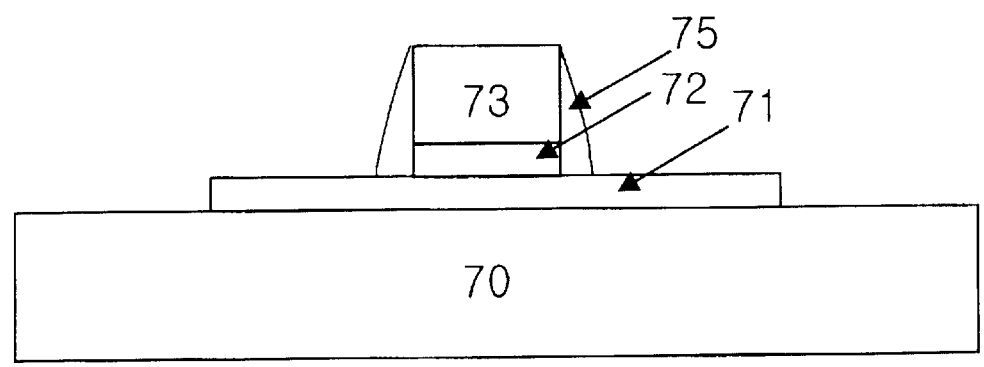
Figure 7D:
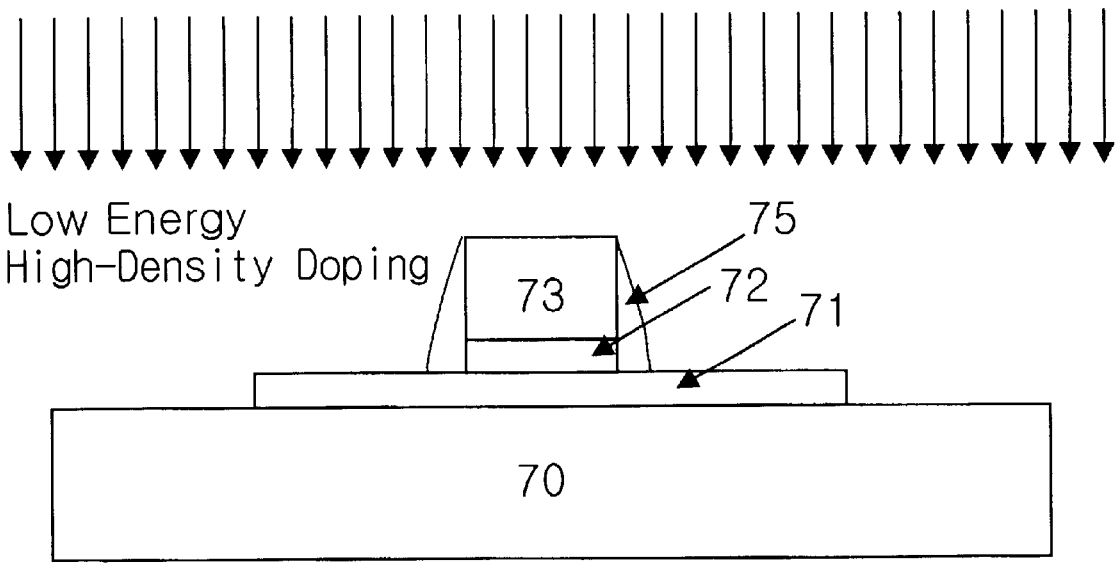
Figure 7E:
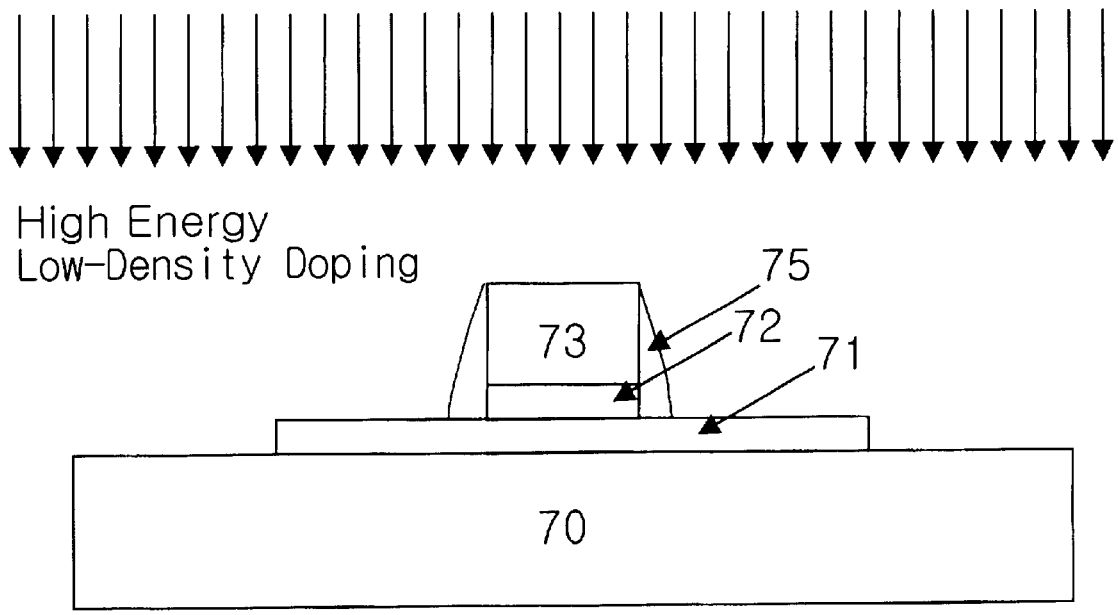
Figure 7F:
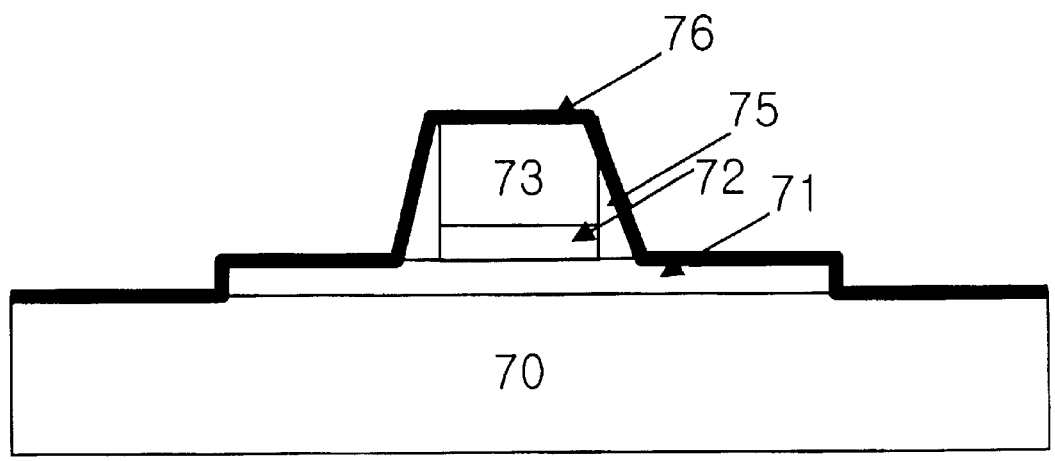
Figure 7G:
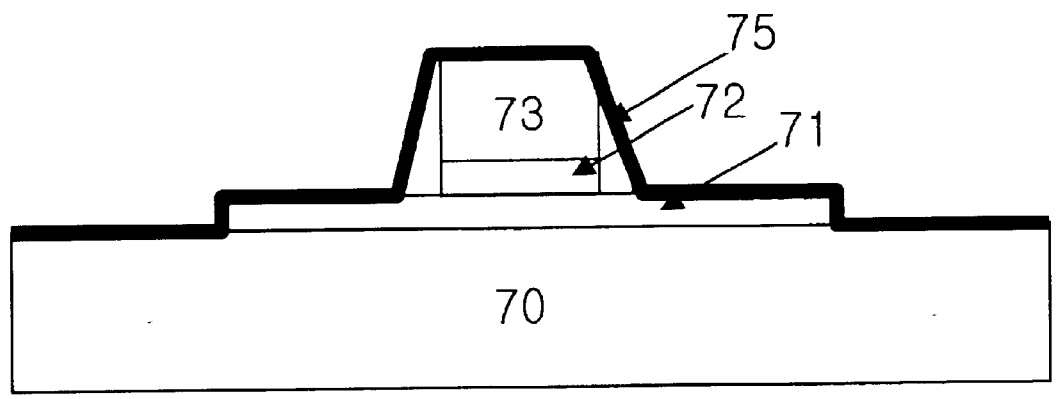

FIG. 7A to FIG. 7G are cross-sectional views illustrating the method for fabricating a crystalline silicon TFT according to a fifth preferred embodiment of the present invention. As shown in FIG. 7A, an amorphous silicon layer 71 providing the active layer of a TFT is formed and patterned on an insulation substrate 70. A gate insulation layer 72 and a gate electrode 73 are formed on the amorphous silicon layer 71. Then, as shown in FIG. 7B, an insulation layer 74 is formed. When an anisotropic etching is conducted on the structure of FIG. 7B, a sidewall 75 is left on lateral surfaces of the gate insulation layer 72 and the gate electrode 73 as shown in FIG. 7C. Using this sidewall 75, one can also achieve the effect of the above-mentioned embodiments. That is, if a high-density impurity doping is conducted at a low energy as shown in FIG. 7D, and a low-density impurity doping is conducted at a high energy as shown in FIG. 7E, an LDD region may be formed on the active layer underneath the sidewall 75. Then, MIC metal 76 is formed as shown in FIG. 7F and a thermal treatment is conducted to crystallize the active layer as shown in FIG, 7G. Thereafter, a transistor is fabricated according to conventional methods. As mention above, the MIC metal also can be formed before the impurity doping process.

Figure 8A:
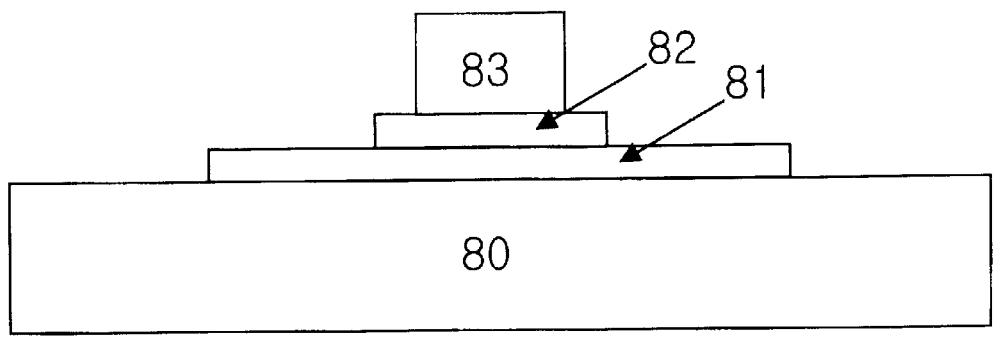
FIG. 8A to FIG. 8E are cross-sectional views illustrating the sequence of a method for fabricating a crystalline silicon TFT according to a sixth preferred embodiment of the present invention.
Figure 8B:
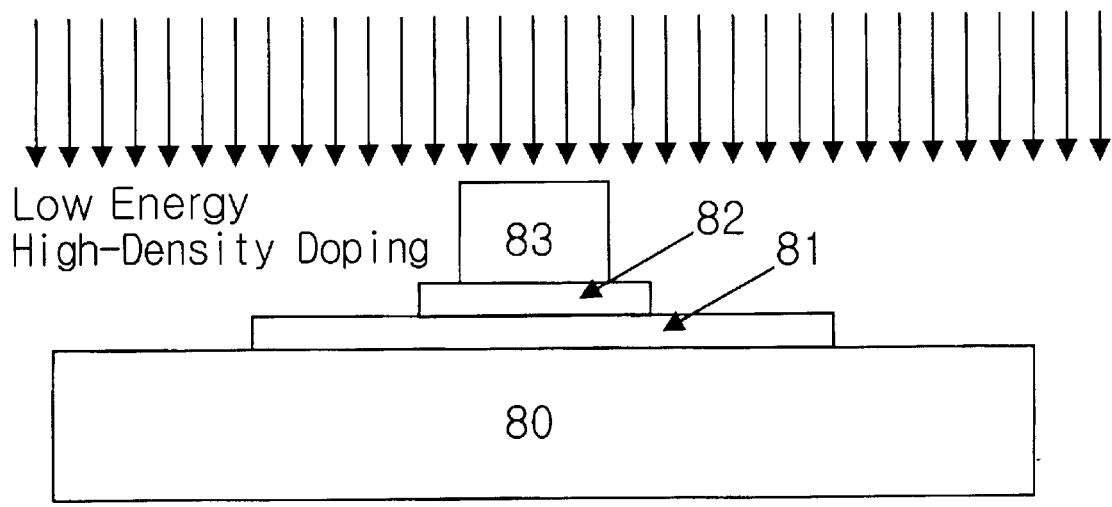
Figure 8C:
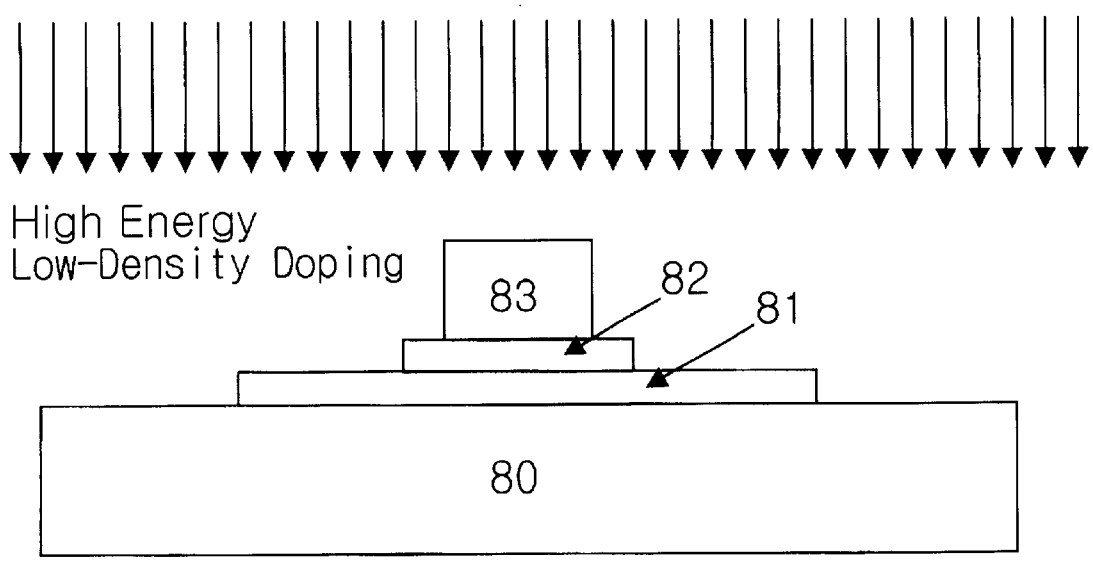
Figure 8D:
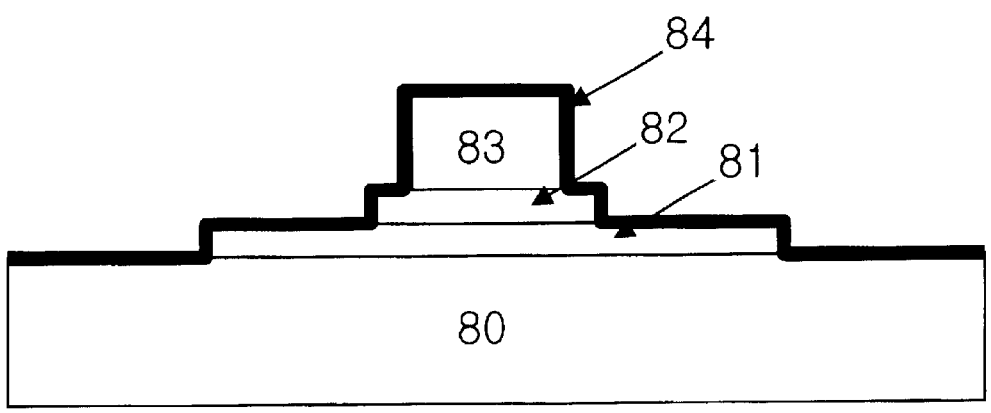
Figure 8E:
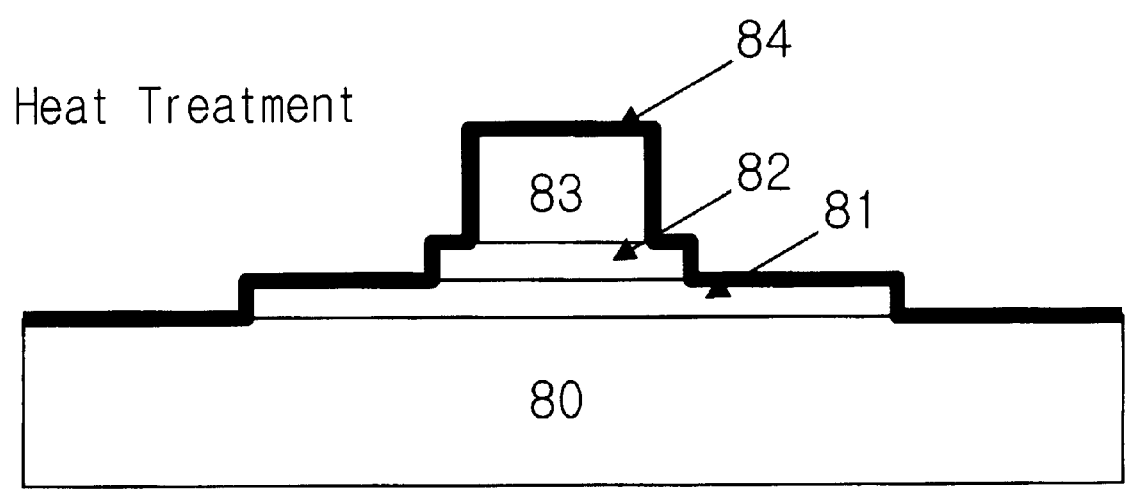

FIG. 8A to FIG. 8D are cross-sectional views illustrating the method for fabricating a TFT according to a sixth embodiment of the present invention. As shown in FIG. 8A, an amorphous silicon layer 81 providing the active layer of a TFT is formed and patterned on an insulation substrate 80. A gate insulation layer 82 and a gate electrode 83 are formed on the amorphous silicon layer 81. In this embodiment, when etching the gate electrode 83 and the gate insulation layer 82, only the gate electrode 83 is over-etched to create an undercut portion. As a result, the gate insulation layer 82 is formed to be broader than the gate electrode 83 as shown in FIG. 8A. Using the gate insulation layer 82 and the gate electrode 83, one can also achieve the effects of the aforementioned embodiments. That is, if a high-density impurity doping is conducted at a low energy (FIG. 8B) and a low-density impurity doping is conducted at a high energy (FIG. 8C) respectively, only a low-density impurity doping is made in the active layer covered with the gate insulation layer 82. Thus, an LDD region is formed in the region covered with the gate insulation layer 82 and not covered by the gate electrode 83. Then, MIC metal 84 such as Ni is formed as shown in FIG. 8D, and thermal treatment is performed to crystallize the active layer as shown in FIG. 8E. Thereafter, a transistor is fabricated according to conventional methods. As mentioned above, the process of forming the MIC metal can be performed before the impurity doping process.

In all of the embodiments described above, the low-density doping process may be omitted. Then, the embodiments of the present invention may be employed to fabricate a TFT not having an LDD region but having an offset junction region.

As described above, a method for fabricating a TFT according to the present invention forms a metal offset region without using an additional photoresist forming process, and dopes the metal offset region with an impurity of a low density so as to form an LDD region. As a result, a transistor fabricated by the present invention has low leakage current in its off-state, and has stable electrical characteristics in its on-state.

Although representative embodiments of the present invention have been disclosed for illustrative purposes, those who are skilled in the art will appreciate that various modifications, additions and substitutions are possible without departing from the scope and spirit of the present invention as defined in the accompanying claims and the equivalents thereof.

What we claim:

1. A method for fabricating a thin film transistor (TFT) including a crystalline silicon active layer with a lightly doped drain (LDD) region or an offset junction region formed in said active layer, comprising the steps of:

providing an active layer of the TFT by forming an amorphous silicon layer on a substrate;

providing a gate insulation layer and a gate electrode of the TFT on said active layer by forming an insulation layer and a metal or poly-silicon layer on said active layer, forming a photoresist layer on the metal layer, and patterning the photoresist layer to have a shape corresponding to a desired shape of said gate electrode;

over-etching said gate insulation layer and said gate electrode using the patterned photoresist as a mask;

conducting high-density impurity doping of said active layer using the patterned photoresist as a mask;

forming a crystallization inducing metal on said active layer using the patterned photoresist as a mask;

removing the patterned photoresist and conducting low-density impurity doping of said active layer; and annealing the active layer to induce crystallization thereof, wherein an LDD region or an offset junction region is formed in a region of the active layer adjoining said gate electrode and the crystallization inducing metal is offset from the gate electrode.

2. The method for fabricating a TFT according to claim 1, wherein said crystallization inducing metal is formed with at least one of Ni, Pd, Ti, Ag, Au, Al, Sn, Sb, Cu, Co, Cr, Mo, Tr, Ru, Rh, Cd and Pt.

3. The method for fabricating a TFT according to claims 1 or 2, wherein said crystallization inducing metal is formed on said active layer to have a thickness of 10 Å to 200 Å by sputtering, heating evaporation, solution coating, or chemical vapor deposition (CVD) method.

4. The method for fabricating a TFT according to claim 3, wherein said active layer is crystallized by thermal treatment using a furnace, RTA(rapid thermal annealing), line scan RTA or excimer laser crystallization (ELC) method.

5. The method for fabricating a TFT according to claim 1, wherein said gate electrode is comprised of multiple gate electrodes and an upper gate electrode of said multiple gate electrodes is used as a mask for forming said LDD region or said offset junction region.

6. The method for fabricating a TFT according to claim 1, wherein a photoresist used to form said gate electrode is re-flowed, and said re-flowed photoresist is used as a mask for forming said LDD region or said offset junction region.

7. A method for fabricating a thin film transistor (TFT) including a crystalline silicon active layer with a lightly doped drain (LDD) region or an offset junction region formed in said active layer, comprising the steps of:

providing an active layer of the TFT by forming an amorphous silicon layer on a substrate;

providing a gate insulation layer and a gate electrode of the TFT on said active layer by forming an insulation layer and a metal layer on said active layer;

forming a photoresist layer on the metal layer and patterning the photoresist layer to have a shape corresponding to a desired shape of said gate electrode;

over-etching said gate electrode and patterning said gate insulation layer using the patterned photoresist as a mask;

removing the patterned photoresist and conducting low-energy high-density impurity doping using the patterned gate insulation layer as a mask and a high-energy low-density impurity doping using the gate electrode as a mask;

forming a crystallization inducing metal on said active layer using the patterned gate insulation layer as a mask; and annealing the active layer to induce crystallization thereof, wherein an LDD region or an offset junction region is formed in a region of the active layer adjoining said gate electrode and the crystallization inducing metal is offset from the gate electrode.

8. The method for fabricating a TFT according to claim 7, wherein said crystallization inducing metal is formed with at least one of Ni, Pd, Ti, Ag, Au, Al, Sn, Sb, Cu, Co, Cr, Mo, Tr, Ru, Rh, Cd and Pt.

9. The method for fabricating a TFT according to claims 7 or 8, wherein said crystallization inducing metal is formed on said active layer to have a thickness of 10 Å to 200 Å by sputtering, heating evaporation, solution coating, or chemical vapor deposition (CVD) method.

10. The method for fabricating a TFT according to claim 9, wherein said active layer is crystallized by thermal treatment using a furnace, RTA (rapid thermal annealing), line scan RTA or excimer laser crystallization (ELC) method.

11. The method for fabricating a TFT according to claim 7, wherein said gate electrode is comprised of multiple gate electrodes and an upper gate electrode of said multiple gate electrodes is used as a mask for forming said LDD region or said offset junction region.

* * * * *